United States Patent
Plombon et al.

(10) Patent No.: US 7,354,849 B2
(45) Date of Patent: Apr. 8, 2008

(54) CATALYTICALLY ENHANCED ATOMIC LAYER DEPOSITION PROCESS

(75) Inventors: John J. Plombon, Portland, OR (US); Adrien R. Lavoie, Beaverton, OR (US); Juan E. Dominguez, Hillsboro, OR (US); Joseph H. Han, San Jose, CA (US); Harsono S. Simka, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 5 days.

(21) Appl. No.: 11/365,082

(22) Filed: Feb. 28, 2006

(65) Prior Publication Data

US 2007/0202678 A1 Aug. 30, 2007

(51) Int. Cl.
*H01L 21/44* (2006.01)

(52) U.S. Cl. .................. 438/597; 438/643; 438/687; 257/E21.01; 427/96

(58) Field of Classification Search ............... 438/597, 438/687; 257/1–798
See application file for complete search history.

(56) References Cited

U.S. PATENT DOCUMENTS

| | | | |
|---|---|---|---|
| 2001/0019891 A1* | 9/2001 | Koh et al. | 438/687 |
| 2002/0009884 A1* | 1/2002 | Pyo | 438/687 |
| 2003/0082296 A1* | 5/2003 | Elers et al. | 427/96 |
| 2005/0124154 A1* | 6/2005 | Park et al. | 438/643 |

* cited by examiner

*Primary Examiner*—Walter L. Lindsay, Jr.
*Assistant Examiner*—Abdulfattah Mustapha
(74) *Attorney, Agent, or Firm*—Rahul D. Engineer (57) ABSTRACT

A method for carrying out a damascene process to form an interconnect comprises providing a semiconductor substrate having a trench etched into a dielectric layer, wherein the trench includes a barrier layer and an adhesion layer, depositing a copper seed layer onto the adhesion layer using an ALD process, depositing an iodine catalyst layer onto the copper seed layer using an ALD process, and depositing a copper layer onto the copper seed layer using an ALD process. The iodine catalyst layer causes the copper layer to fill the trench by way of a bottom-up fill mechanism. The trench fill is performed using a single ALD process, which minimizes the creation of voids and seams in the final copper interconnect.

15 Claims, 8 Drawing Sheets

CATALYTICALLY ENHANCED ATOMIC LAYER DEPOSITION PROCESS

BACKGROUND

In the manufacture of integrated circuits, copper interconnects are used to couple various circuit devices, such as transistors and capacitors. Copper interconnects are generally formed on a semiconductor substrate using a copper damascene process (e.g., a dual damascene process which is well known in the art). In this process, a trench is etched into a dielectric layer and the trench is filled with a barrier layer, an adhesion layer, and a seed layer. For instance, a physical vapor deposition (PVD) process, such as a sputter process, may be used to deposit a non-conformal tantalum nitride barrier layer and a non-conformal tantalum adhesion layer (i.e., a TaN/Ta stack) into the trench. This may be followed by a PVD sputter process to deposit a non-conformal copper seed layer into the trench. A plating process may then be used to fill the trench with copper metal and a chemical mechanical polishing (CMP) process may be used to remove excess metal and complete formation of the interconnect.

Copper interconnects that are formed by conventional damascene processes tend to suffer from issues such as micro-voids and seams. This is a result of using two separate processes to form the copper interconnect, the first being the PVD seed layer deposition and the second being the plating trench fill deposition. The use of two separate deposition processes creates other issues as well, such as increased throughput time, increased wafer handling, and reduced copper film quality. Accordingly, alternate deposition methods for copper metal into a trench are needed.

DETAILED DESCRIPTION

Described herein are systems and methods of forming a copper interconnect. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Implementations of the invention use a catalytically enhanced atomic layer deposition (CEALD) process to deposit copper metal into a trench during a damascene process to form a copper interconnect structure. A CEALD process is an atomic layer deposition process that uses a catalyst to enhance or accelerate the deposition rate of the metal being deposited. In some CEALD processes, iodine may be used as the catalyst. For purposes of this disclosure, however, CEALD refers to an atomic layer deposition process that uses any catalyst.

The CEALD process may be used to fill the trench in lieu of depositing a copper seed layer using a physical vapor deposition (PVD) process and then depositing a bulk copper layer using a plating process, as is typically done in damascene processes. The use of a single CEALD process reduces the number of process steps for the damascene process, reduces the number of tools required, and improves the reliability and quality of the copper interconnect.

Figure 1A:
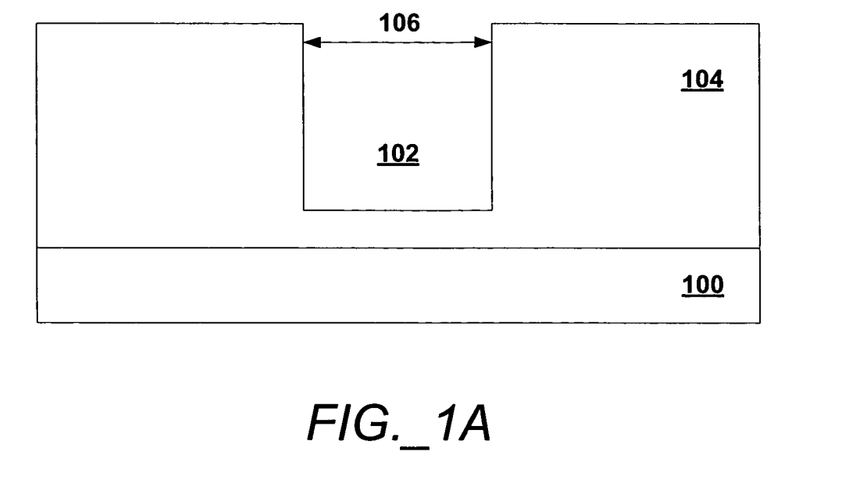
FIGS. 1A to 1E illustrate a conventional damascene process for building a metal interconnect.

For reference, FIGS. 1A to 1E illustrate a conventional damascene process for forming copper interconnects on a semiconductor wafer 100. FIG. 1A illustrates a substrate 100, such as a semiconductor wafer, that includes a trench 102 that has been etched into a dielectric layer 104. The trench 102 includes a gap 106 through which metal may enter during metallization processes.

Figure 1B:
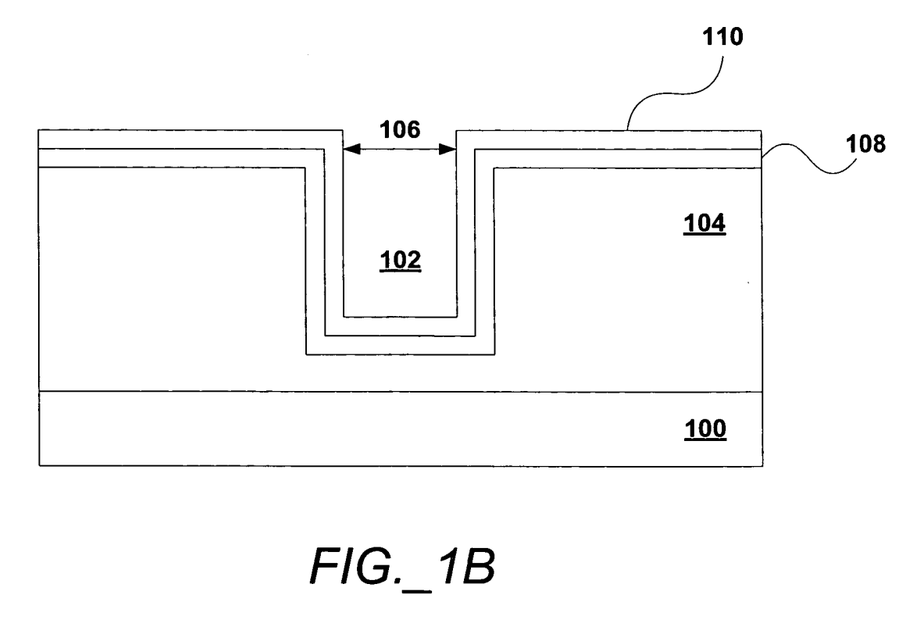

FIG. 1B illustrates the trench 100 after a conventional barrier layer 108 and a conventional adhesion layer 110 have been deposited. The barrier layer 108 prevents copper metal from diffusing into the dielectric layer 104. The adhesion layer 110 enables copper metal to become deposited onto the barrier layer 108. The barrier layer 108 is generally formed using a material such as tantalum nitride (TaN) and is deposited using a PVD process. The adhesion layer 110 is generally formed using a metal such as tantalum (Ta) or ruthenium (Ru) and is also deposited using a PVD process.

After the adhesion layer 110 is formed, the conventional damascene process of FIG. 1 uses two independent deposition processes to fill the trench 102 with copper metal. The first deposition process is a PVD process that forms a non-conformal copper seed layer. The second deposition process is a plating process, such as an electroplating (EP) process or an electroless plating (EL) process, that deposits a bulk copper layer to fill the trench 102.

Figure 1C:
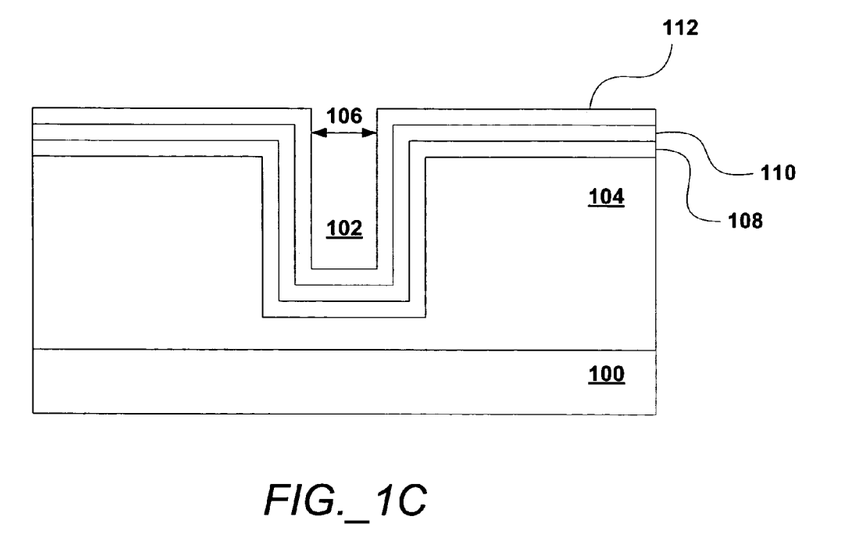

FIG. 1C illustrates the trench 102 after a conventional copper seed layer 112 has been deposited onto the adhesion layer 110 using a PVD process. The copper seed layer 112 enables or catalyzes a subsequent plating process to fill the interconnect with copper metal. The deposition of the copper seed layer 112 reduces the available gap 106 for subsequent metallization.

Figure 1D:
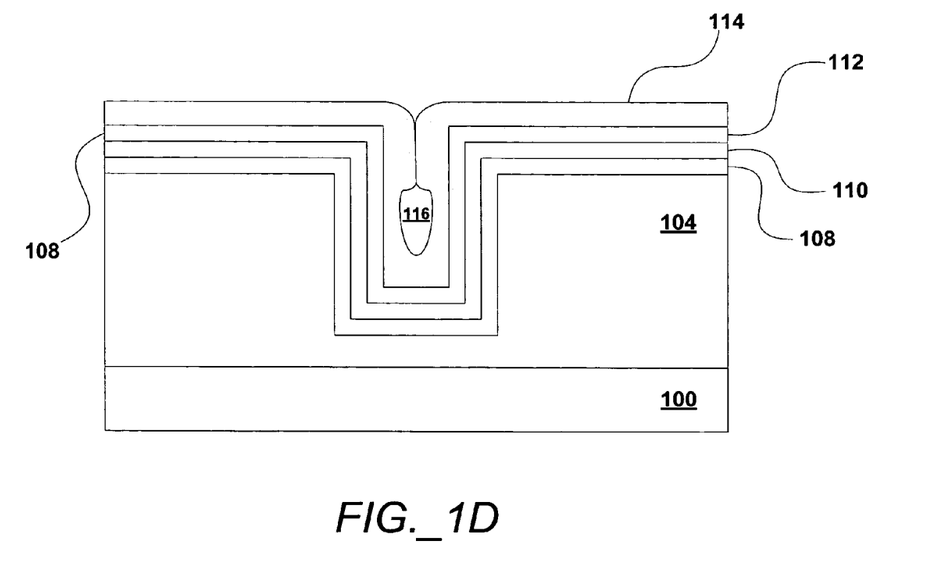

FIG. 1D illustrates the trench 102 after an EP or EL copper deposition process has been carried out. Copper metal 114 enters the trench through the gap 106 where, due to the narrow width of the gap 106, issues such as trench overhang and pinching off of the trench opening may occur that lead to defects. For instance, as shown in FIG. 1D, trench overhang may occur that pinches off the opening of the trench 102, creating a void 116 that will appear in the final interconnect structure.

Figure 1E:
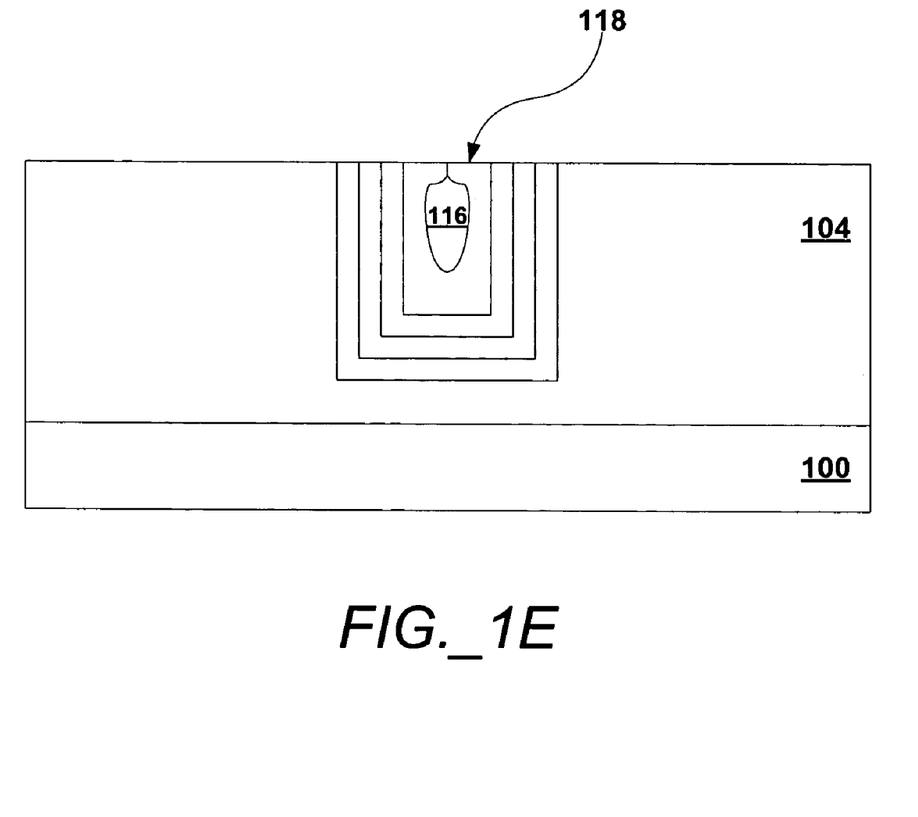

FIG. 1E illustrates the trench 102 after a chemical mechanical polishing (CMP) process is used to planarize the deposited copper metal 114. The CMP results in the formation of a copper interconnect 118. As shown, the copper interconnect 118 includes the void 116 that was formed when the available gap 106 was too narrow and the resulting trench overhang pinched off the trench opening.

In addition to forming voids, the use of two independent deposition processes to form the copper seed layer and the bulk copper layer presents many other problematic issues. One issue is that two separate sets of processing tools are required, one set to perform a PVD deposition and another set to perform the EP or EL deposition. This increases throughput time and increases the amount of wafer handling that occurs. Another issue is that the EP or EL process may introduce contaminants into the deposited copper metal from organic additives that are in the plating bath. Furthermore, because the copper interconnect is formed using two separate deposition processes, the copper layer may be less reliable and have lower film quality than a copper layer that is formed using a single deposition process. For instance, the use of a PVD process followed by an EP or EL process tends to introduce micro-voids and seams into the copper layer, such as a seam between the copper seed layer 112 and the copper layer 114. These issues often lead to manufacturing defects that result in yield losses.

Accordingly, implementations of the invention provide a damascene process to form a copper interconnect where only one type of deposition process is used to completely fill a trench with copper metal. In some implementations, that deposition process is a chemical vapor deposition (CVD) process that performs a bottom-up fill of the trench with copper metal. The use of a CVD process to completely fill the trench eliminates the need for an EP or EL process to deposit a bulk copper layer, thereby reducing throughput time, reducing the amount of wafer handling, and eliminating copper contamination from a plating bath.

In accordance with implementations of the invention, the CVD process may be a catalytically-enhanced ALD (CEALD) process. The catalyst used in some implementations of the CEALD process of the invention may be iodine. In further implementations of the invention, the CVD process may be a plasma enhanced CVD (PECVD) or ALD (PEALD) process where a catalytic plasma, such as an iodine plasma, is utilized.

Figure 2:
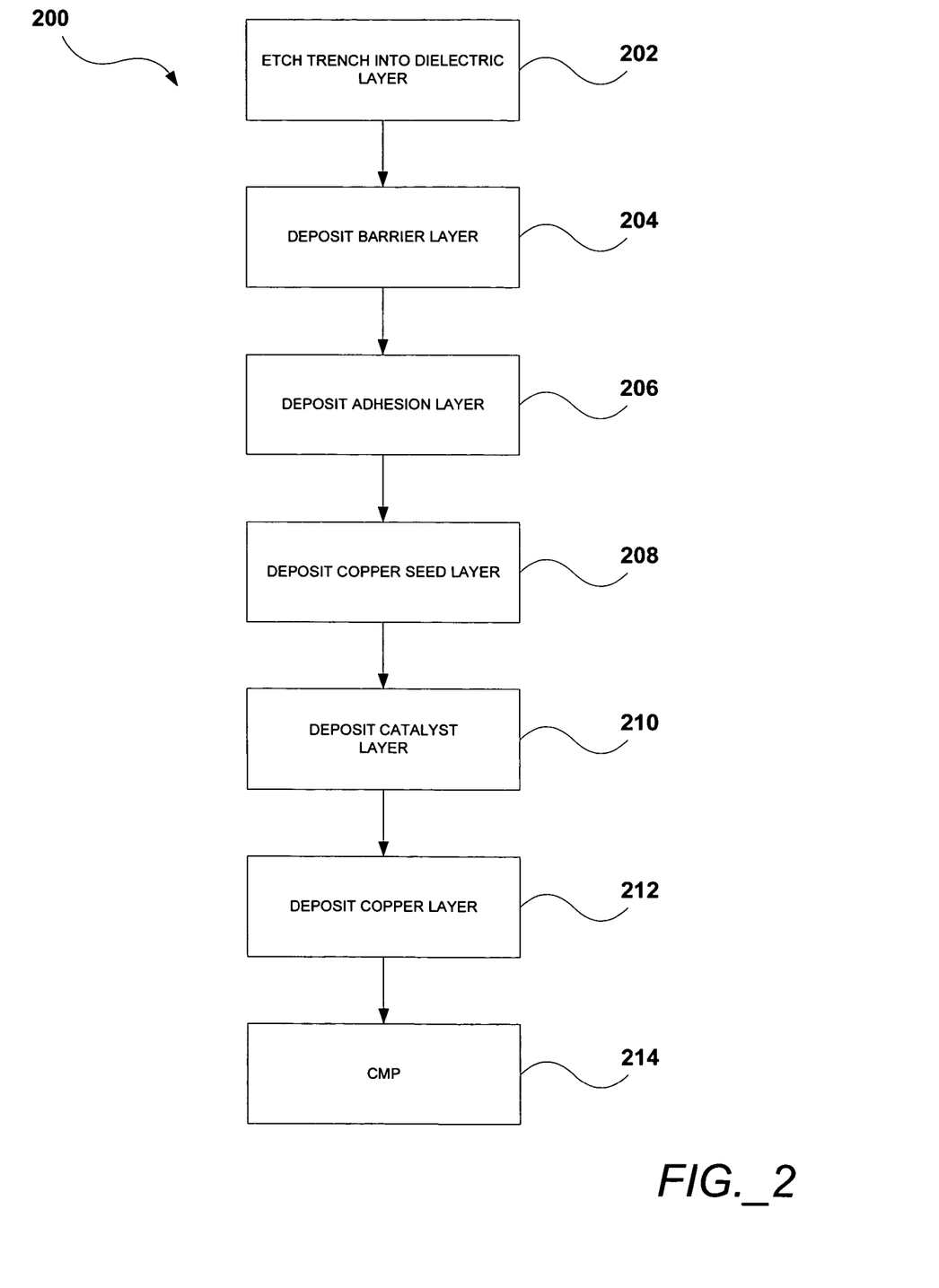
FIG. 2 is a method for building a copper interconnect in accordance with an implementation of the invention.

FIG. 2 is a process 200 of forming a copper interconnect in accordance with an implementation of the invention. FIGS. 3A to 3H illustrate various structures that are formed when the process 200 is carried out. For clarity, the structures of FIGS. 3A to 3H will be referenced during the discussion of the process 200 of FIG. 2.

Figure 3A:
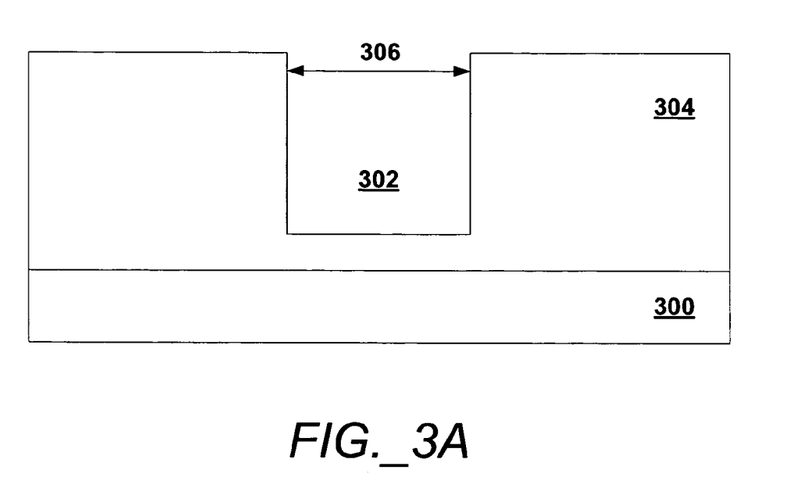
FIGS. 3A to 3H illustrate structures that are formed while carrying out the method of FIG. 2.

The process 200 begins with the etching of a trench into a dielectric layer for forming copper interconnects on a semiconductor wafer (process 202 of FIG. 2). FIG. 3A illustrates semiconductor wafer 300 that includes at least one trench 302 that has been etched into a dielectric layer 304. The trench 302 has a gap 306 through which metal may enter the trench 302 during metallization processes. The dielectric layer 304 is formed on the semiconductor wafer 300 and provides insulation between electrical components. As semiconductor device dimensions decrease, electrical components such as interconnects must be formed closer together. This increases the capacitance between components with the resulting interference and crosstalk degrading device performance. To reduce the interference and crosstalk, dielectric materials with lower dielectric constants (i.e., low-k dielectric materials) are used to provide insulation between electrical components. Common dielectric materials that may be used in the dielectric layer 304 include, but are not limited to, oxides such as silicon dioxide ($SiO_2$) and carbon doped oxide (CDO), organic polymers such as perfluorocyclobutane (PFCB), or fluorosilicate glass (FSG).

Conventional photolithography techniques may be used to etch the trench 302 into the dielectric layer 304. As is well known in the art, one photolithography technique includes depositing a photoresist material onto the dielectric layer 304, exposing the photoresist material to ultraviolet radiation using a patterned mask, developing the photoresist material, etching the dielectric layer 304, and removing the photoresist material. The photoresist material that remains after development functions as a mask to allow only selected portions of the dielectric layer 304 to be etched, thereby forming structures such as the trench 302.

Next, a barrier layer may be deposited into the trench (process 204 of FIG. 2). The barrier layer is generally formed using a material such as tantalum nitride (TaN) and prevents copper metal from diffusing into the dielectric layer, which would likely reduce performance of the interconnect and may lead to electrical shorts. In various implementations of the invention, a PVD process or an ALD process may be carried out within a reaction chamber to deposit the barrier layer. For instance, the semiconductor wafer may be placed in a reaction chamber and barrier layer precursors (i.e., precursors containing tantalum and nitrogen) may be pulsed into the reaction chamber with appropriate co-reactants and under appropriate ALD process conditions to react and form a TaN barrier layer.

After the barrier layer is deposited, an adhesion layer may be deposited into the trench (process 206 of FIG. 2). The adhesion layer is generally formed using a metal such as tantalum (Ta) or ruthenium (Ru) and enables copper metal to become deposited onto the barrier layer. Copper metal generally cannot deposit directly onto TaN, therefore the adhesion layer acts as an intermediary to bind the copper metal to the barrier layer. In various implementations of the invention, a PVD process or an ALD process may be used to deposit the barrier layer. Similar to above, the semiconductor wafer may be placed in a reaction chamber and adhesion layer precursors (i.e., precursors containing tantalum or ruthenium) may be pulsed into the reaction chamber with appropriate co-reactants and under appropriate ALD process conditions to react and form a Ta or Ru adhesion layer.

In some implementations, the same type of deposition process is used to deposit both the barrier layer and the adhesion layer. For instance, an ALD process may be used to first deposit the barrier layer and then deposit the adhesion layer within the same reaction chamber. This minimizes the number of processing tools required and decreases the amount of wafer handling that occurs.

Figure 3B:
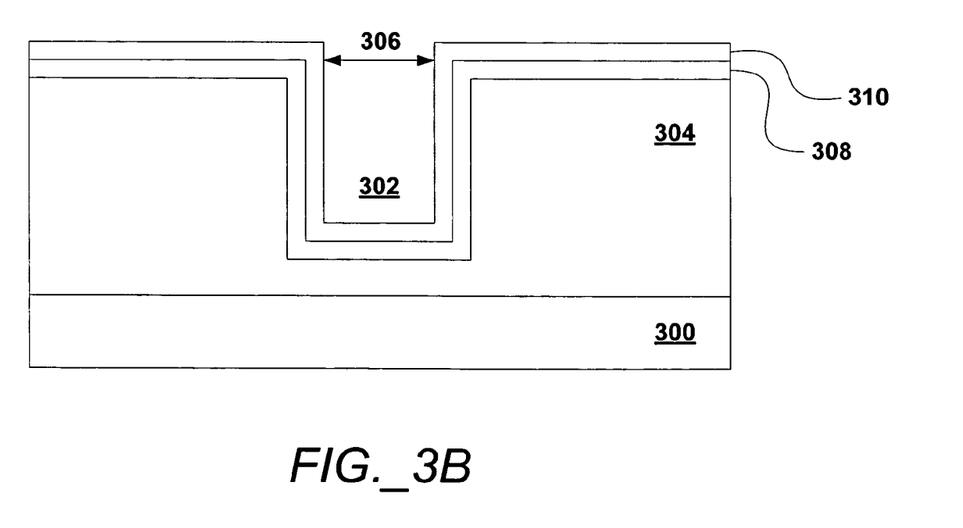

FIG. 3B illustrates the trench 302 after a conventional barrier layer 308 and a conventional adhesion layer 310 have been deposited. As shown in FIG. 3B, the deposition of the TaN barrier layer 308 and the adhesion layer 310, a combination that is often referred to as a TaN/Ta stack 308/310 or a TaN/Ru stack, narrows the available gap 306 for subsequent metallization.

After the adhesion layer is deposited, an ALD process, such as a CEALD process, may be utilized to completely fill the trench with copper metal. In accordance with an implementation of the invention, the CEALD process begins by introducing a first set of copper precursor pulses into the reaction chamber that react to deposit a conformal copper seed layer (process 208 of FIG. 2). The first set of copper precursor pulses may consist of a single pulse or may consist of multiple pulses. One or more co-reactants may also be pulsed into the reaction chamber to react with the copper precursor and form the copper seed layer.

The copper precursor may be any of a variety of conventional precursors for copper deposition, including but not limited to organometallic precursors. Examples of copper precursors that may be used include, but are not limited to, $Cu(acac)_2$ (where acac=acetylacetonato); $Cu(thd)_2$ (where thd=tetrahydrodionato); hexafluoroacetylacetonate-copper-vinyltrimethylsilane; cyclopentadienyl (Cp) compounds such as CpCu(CNMe), $CpCu(CNCMe_3)$, Cp*CuCO, $CpCuPR_3$ (where R=Me, Et, or Ph), and $CpCu(CSiMe_3)_2$; alkyl or aryl compounds such as $MeCu(PPh_3)_3$, CuMe, CuCCH(ethynylcopper), $CuCMe_3$(methylacetylidecopper), $(H_2C\!\!=\!\!CMeCC)Cu$(3-methyl-3-buten-1-ynylcopper), $(MCH_2CH_2CC)Cu$(1-pentynylcopper), CuCCPh, $C_6H_5Cu$ (phenyl copper), $(Me)_3CCCCu$(3,3-dimethyl-1-butynyl) copper, $(H_3CCH\!\!=\!\!CH)_2CuLi$, $Me_3SiCCCH_2Cu$; and other compounds such as CuCN, n (where OAc=acetate), $Cu_2Cl_2$ (butadiene), μ-copper, $C_7H_7CuO$(2-methoxyphenylcopper), $(CuCl)_2$, $(MeCN)_4CuX$ (where X=a halide, an alkyl, an amine, or a phenyl group), $Me_3SiOCu(PMe_3)_3$, $Cu(C_4H_4S)$, and Cu-carbene compounds, e.g., those that are imidazolium-derived.

Figure 3C:
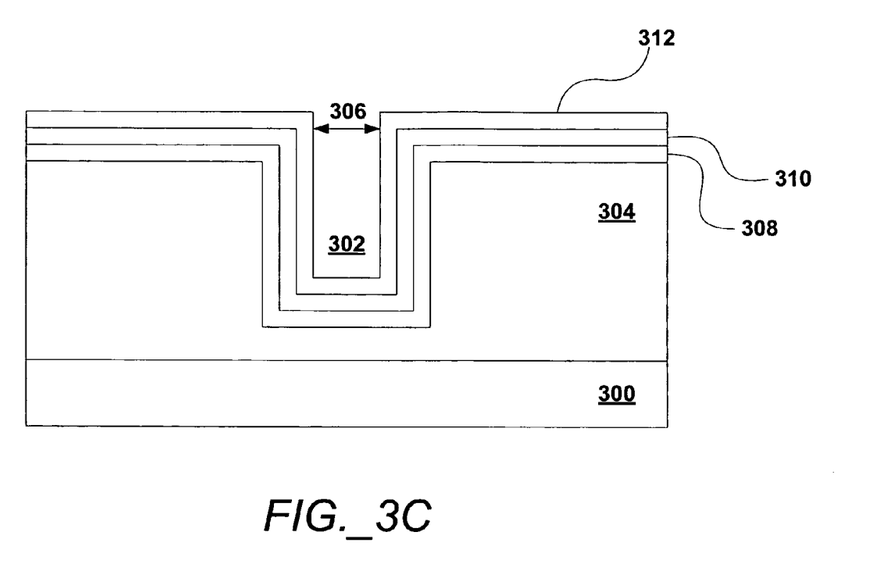

The one or more co-reactants may consist of any of a variety of conventional co-reactants for copper deposition. Co-reactants that may be used with the above listed copper precursors include, but are not limited to, hydrogen ($H_2$), $H_2$ plasma, $NH_3$, silane, $B_2H_6$, oxygen ($O_2$), forming gas (e.g., 5% $H_2$ in $N_2$), and mixtures thereof. Conventional process parameters may be used for the CEALD deposition of the copper seed layer within the reaction chamber. FIG. 3C illustrates the trench 302 after a copper seed layer 312 has been deposited.

Next, the CEALD process may introduce at least one catalyst pulse into the reaction chamber (process 210 of FIG. 2). One or more co-reactants may be introduced as well. The catalyst pulse leads to the formation of a catalyst layer that enhances or accelerates copper deposition. The resulting catalyst layer tends to favor depositing on the trench bottom rather than on the trench sidewalls. As a result, the rate of the subsequent copper deposition will be accelerated on the trench bottom over the trench sidewalls, thereby producing what is referred to as a bottom-up fill mechanism. In implementations of the invention, the catalyst layer may be iodine. Iodine has been demonstrated to produce a bottom-up fill of various metals in features such as trenches. Furthermore, iodine is often used as an activator in electroplating processes for copper deposition within trenches. In various implementations of the invention, the iodine may be pulsed into the reaction chamber as $I_2$ gas, as an iodine plasma, or in the form of iodine precursors. If an $I_2$ gas or iodine plasma is used, the iodine tends to be absorbed onto the copper seed layer to form a catalyst layer.

If the iodine is introduced by way of a precursor, examples of iodine precursors that may be used include, but are not limited to, iodine ($I_2$), ethyl iodide ($C_2H_5I$), $C_2H_3I$, iodomethane ($CH_3I$), diiodomethane ($CH_2I_2$), and triiodomethane ($CHI_3$). The iodine precursor tends to react within the reaction chamber to form iodine that is absorbed onto the surface of the copper seed layer, thereby forming the catalyst layer. In alternate implementations of the invention, in lieu of iodine, the CEALD process may use a halogen catalyst such as bromine. Examples of bromine precursors include, but are not limited to, bromine ($Br_2$), $CH_3Br$, and $C_2H_5Br$. In further implementations of the invention, alternate catalysts that can enable a bottom-up fill mechanism of the trench with a metal may be used.

Figure 3D:
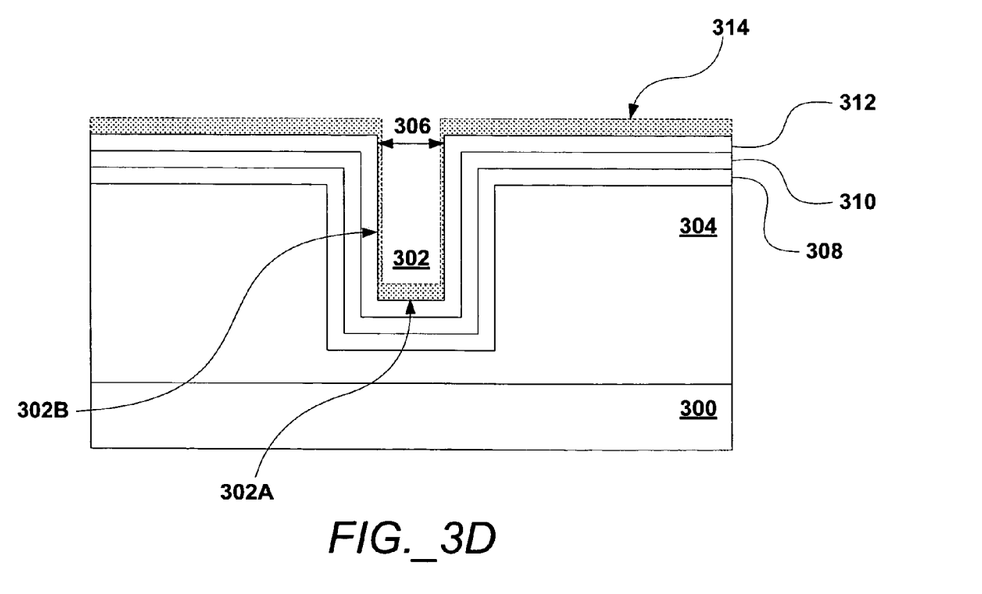

FIG. 3D illustrates the trench 302 after a catalyst 314 has been pulsed into the reaction chamber. As shown, the catalyst 314 tends to favor building up on the trench bottom 302A over the trench sidewalls 302B.

After the catalyst is pulsed into the reaction chamber, the CEALD process continues by pulsing one or more copper precursors into the reaction chamber to form a copper metal layer atop the copper seed layer and the catalyst (process 212 of FIG. 2). As with the copper seed layer, the copper precursor may be any of a variety of conventional precursors for copper deposition, including but not limited to organometallic precursors. One or more co-reactants may also be pulsed into the reaction chamber, and any of a variety of conventional co-reactants for copper deposition may be used. The same copper precursors and co-reactants listed above to form the copper seed layer may be used here.

As described above, the rate of copper deposition on the trench bottom is substantially higher than the rate of copper deposition on the trench sidewalls due to the presence of the catalyst. This results in a bottom-up fill mechanism that minimizes issues such as trench overhang and pinching off of the gap available for metallization. This also enables the trench to be filled with copper metal without the need for a separate EP or EL deposition process. As will be recognized by those of skill in the art, as the trench fills with copper metal, the bottom-up fill mechanism will tend to accelerate. This is because as the trench bottom rises, it collects catalyst off the trench sidewalls. This accumulation of catalyst further accelerates copper deposition on the trench bottom, thereby enabling a complete and substantially void-free trench fill.

Figure 3E:
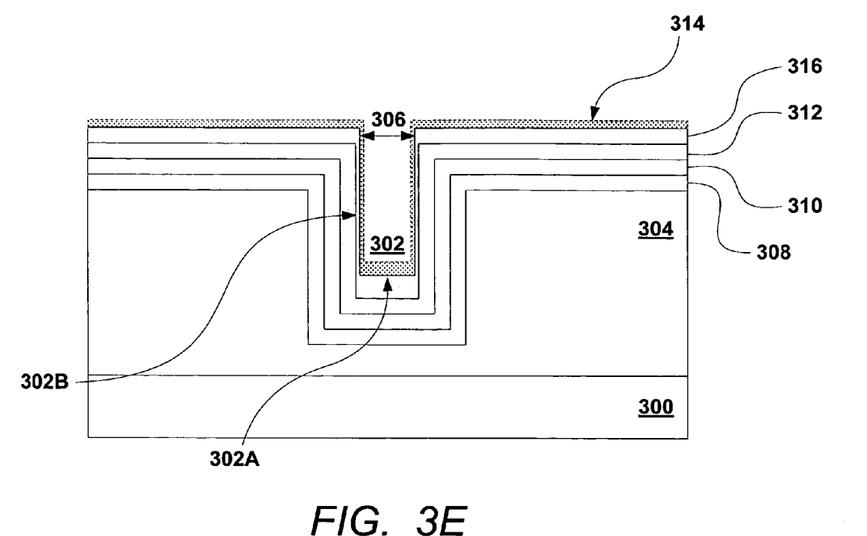
Figure 3F:
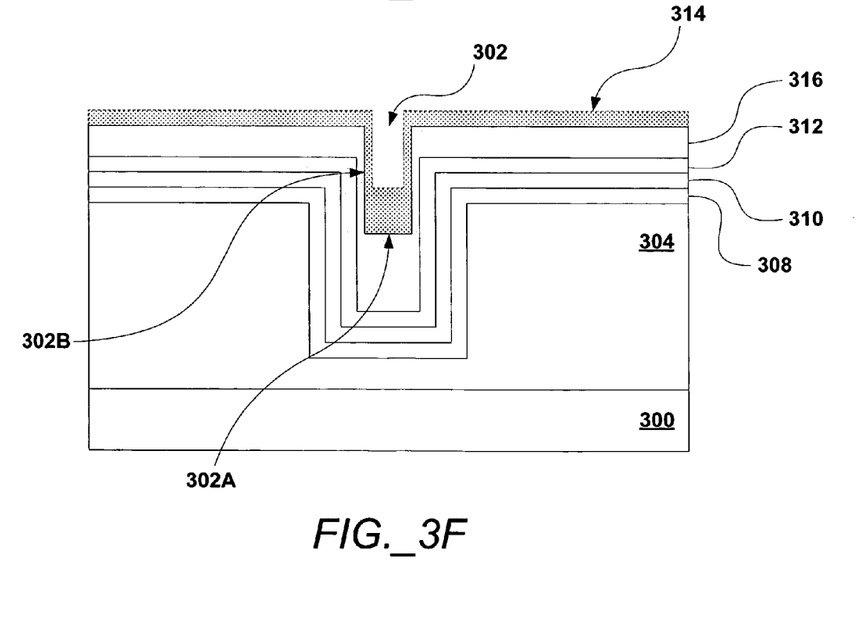
Figure 3G:
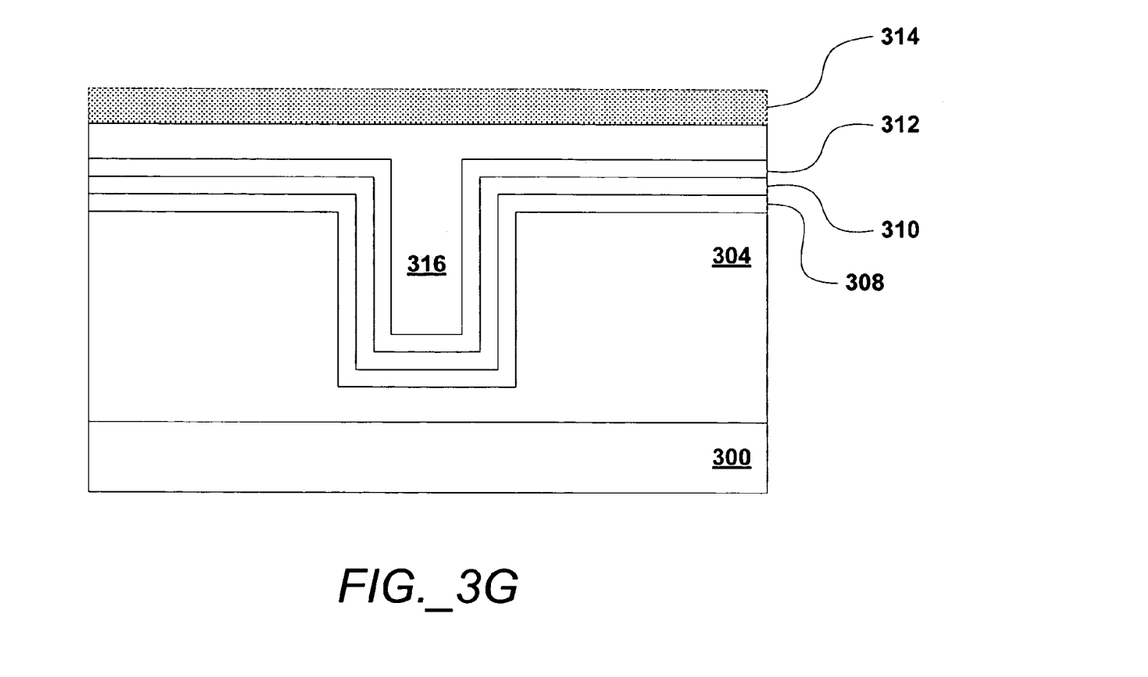

FIGS. 3E to 3G illustrate the bottom-up fill mechanism that is produced by the CEALD process of the invention. FIG. 3E illustrates a copper metal layer 316 that has begun to deposit within the trench 302 atop the copper seed layer 312. As shown, the catalyst 314 promotes a bottom-up fill mechanism that causes more of the copper metal 316 to become deposited on the trench bottom 302A than on the trench sidewalls 302B.

FIG. 3F illustrates the trench 302 about mid-way through the CEALD process of the invention. The copper metal layer 316 continues the bottom-up fill mechanism and the catalyst 314 moves from the trench sidewalls 302B to the trench bottom 302A as the trench bottom 302A rises. This accumulation of catalyst 314 on the trench bottom 302A further accelerates the bottom-up fill process and further reduces issues such as trench overhang.

FIG. 3G illustrates the trench 302 after the CEALD process has completely filled the trench 302 with copper metal 316. The catalyst 314 forms a layer atop the deposited copper metal 316.

Figure 3H:
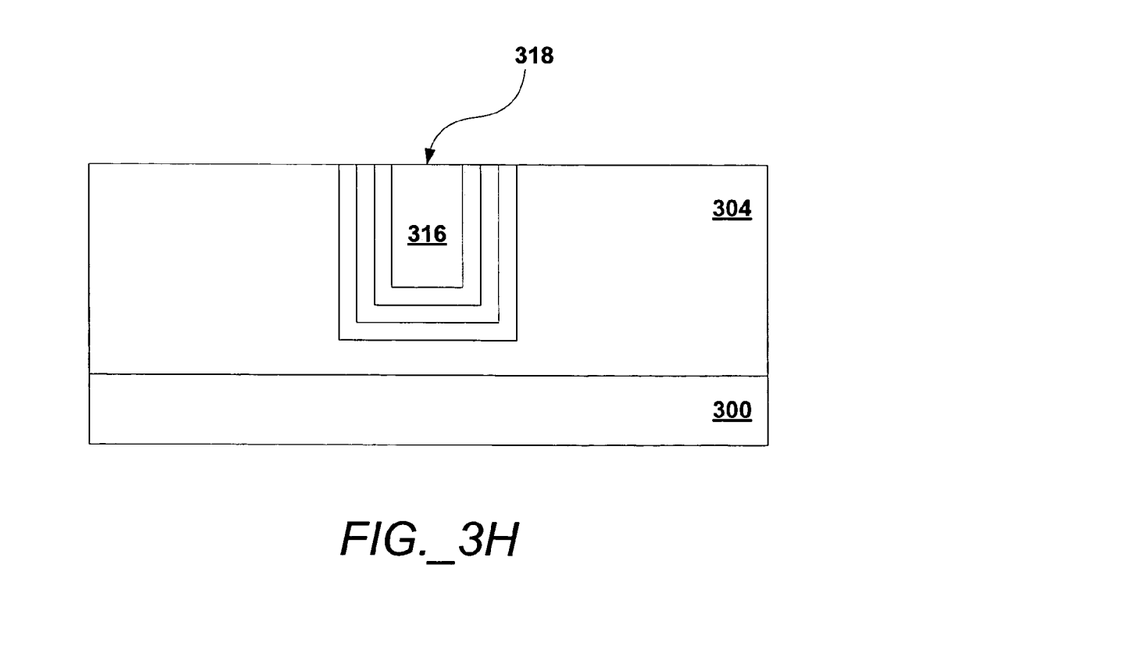

Finally, a CMP process may be utilized to remove excess copper metal and catalyst, thereby completing the formation of the copper interconnect (process 214 of FIG. 2). FIG. 3H illustrates the trench 302 after the CMP process is used to form the final copper interconnect 318. As shown, the copper interconnect 318 does not include any voids.

In accordance with implementations of the invention, the bottom-up fill mechanism may be adjusted or tuned to produce a particularly desired result. In one implementation, the bottom-up fill mechanism may be tuned by controlling the amount of catalyst that is pulsed into the reaction chamber. For instance, the duration and/or concentration of the catalyst pulse may be adjusted to produce different amounts of catalyst within the trench. In some implementations, only one catalyst pulse may be used, while in other implementations, the bottom-up fill mechanism may be adjusted or tuned using a series of catalyst pulses either prior to or throughout the copper deposition. In some implementations of the invention, the copper seed layer deposition may also be adjusted using the catalyst. For instance, the copper seed deposition may include one or more pulses of the catalyst interspersed among the first set of copper precursor pulses. One or more pulses of a co-reactant such as hydrogen may be interspersed as well.

In an alternate implementation of the invention, metals such as gold or silver may be used to form the metal interconnect in lieu of copper metal. Furthermore, in some implementations of the invention, a catalytic metal may be used as the catalyst in lieu of iodine. Catalytic metals that may be used as the catalyst include, but are not limited to, indium compounds such as indium acetate, indium acetylacetonate, indium (III) chloride, indium (III) bromide, indium (III) iodide, and trimethylindium, and tin compounds such as tin hydride ($SnH_4$), tin acetate, tetraethyltin, and tin acetylacetonate.

In an implementation of the invention, ALD processes may be used to form the barrier layer, the adhesion layer, and the copper layer. This allows one reaction chamber to be used for multiple deposition processes, thereby improving throughput time, decreasing wafer handling, and decreasing the number of processing tools required. In addition, the use of ALD processes for all of these layers results in thinner barriers with larger copper line volume and lower RC delay.

Implementations of the invention therefore provide a CEALD process for trench fill without the need for an EP or EL process. Eliminating the EP or EL deposition process allows a single deposition process to be used for trench fill, thereby reducing or eliminating the occurrence of microvoids and seams. And because the CEALD deposition process occurs completely in the vapor-phase, contamination and residue issues typically associated with EP and EL deposition processes are eliminated. The end result is a relatively smooth, higher quality copper metal surface that is more reliable. The methods of the invention further allow for a copper deposition process that does not require fluorine containing precursors that generally lead to adhesion and reliability issues.

As will be understood by those of ordinary skill in the art, process parameters such as precursor temperature, substrate temperature, chamber pressure, precursor concentrations, precursor flow rates, pulse durations, and purging cycles may vary over a wide range of values based on numerous factors. These factors include, but are not limited to, the needs of a particular process, the desired thickness of each of the layers formed, the interconnect properties desired, the specific precursors chosen, the specific metal chosen for the interconnect, the specific catalyst chosen, the specific co-reactants chosen, the type of reaction chamber that is used, and the specific tools that are used to carry out the ALD process.

For instance, in one implementation of the invention, a cold wall reaction chamber may be used with a deposition temperature of around 150° C. and a pressure around 5 Torr. The copper precursor may consist of hexafluoroacetylacetonate-copper-vinyltrimethylsilane in liquid form that is vaporized at a temperature of around 60° C. using a delivery system that is held at around 60° C. The iodine precursor may consist of iodoethane ($C_2H_5I$) that is injected directly into the reactor at a temperature around 150° C. for 30 seconds. These process parameters may be used on a patterned semiconductor substrate with a dielectric layer formed of CDO and a TaN/Ta stack within the trenches.

In other implementations, the process parameters may include precursor temperatures that range from around 50° C. to around 500° C., substrate temperatures that range from around 150° C. to around 600° C., chamber pressures that range from around 0.01 Torr to around 10 Torr, precursor flow rates that range up to 10 standard liters per minute (SLM), pulse durations that range from 0.1 seconds to 60 seconds, purge durations that range from 0.1 seconds to 60 seconds, and purge gases that consist of inert gases such as helium (He), $N_2$, or forming gas. In other implementations, process parameters different from these may be used. It should be noted that the scope of the invention includes any possible set of process parameters that may be used to carry out the implementations of the invention described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. A method comprising:
providing a semiconductor substrate having a trench etched into a dielectric layer, wherein the trench includes a barrier layer and an adhesion layer; and
performing a catalytically enhanced atomic layer deposition process that comprises:
pulsing a first copper precursor to form a copper seed layer on the adhesion layer;
pulsing an iodine precursor to form an iodine catalyst layer on the copper seed layer; and
pulsing a second copper precursor to form a copper layer on the copper seed layer that fills the trench by way of a bottom-up fill mechanism due to the iodine catalyst layer;
wherein the first and second copper precursors are selected from the group consisting of $Cu(acac)_2$ (where acac=acetylacetonato), $Cu(thd)_2$ (where thd=tetrahydrodionato), CpCu(CNMe), CpCu(CNCMe$_3$), Cp*CuCO, CpCuPR$_3$ (where R=Me, Et, or Ph), CpCu(CSiMe$_3$)$_2$, MeCu(PPh$_3$)$_3$, CuMe, CuCCH (ethynylcopper), CuCMe$_3$ (methylacetylidecopper), ($H_2C$=CMeCC)Cu (3-methyl-3-buten-1-ynylcopper), (MCH$_2$CH$_2$CC)Cu (1-pentynylcopper), CuCCPh, $C_6H_5Cu$ (phenyl copper), (ME)$_3$CCCCu (3,3-dimethyl-1-butynyl)copper, ($H_3$CCH=CH)$_2$CuLi, Me$_3$SiCCCH$_2$Cu, CuCN, [Cu(OAc)]n (where OAc=acetate), Cu$_2$Cl$_2$(butadiene), μ-[(trimethylsilyl)methyl]copper, $C_7H_7$CuO(2-methoxyphenylcopper), ([COD]CuCl)$_2$, (MeCN)$_4$CuX (where X=a halide, an alkyl, an amine, or a phenyl group), Me$_3$SiOCu (PMe$_3$)$_3$, Cu(C$_4$H$_4$S), and a Cu-carbene compound, and
wherein the iodine precursor is selected from the group consisting of an iodine gas, an iodine plasma, $I_2$, $C_2H_5I$, $C_2H_3I$, $CH_3I$, $CH_2I_2$, and $CHI_3$.

2. The method of claim 1, further comprising planarizing the copper layer.

3. The method of claim 1, wherein the barrier layer and the adhesion layer are formed using ALD processes.

4. A method comprising:
providing a semiconductor substrate having a trench etched into a dielectric layer;

placing the semiconductor substrate within a reaction chamber;

pulsing a barrier layer precursor into the reaction chamber, wherein the barrier layer precursor reacts to form a barrier layer within the trench;

pulsing an adhesion layer precursor into the reaction chamber, wherein the adhesion layer precursor reacts to form an adhesion layer atop the barrier layer;

pulsing a first copper precursor into the reaction chamber, wherein the first copper precursor reacts to form a copper seed layer atop the adhesion layer;

pulsing a catalyst into the reaction chamber, wherein the catalyst forms a catalyst layer that favors collecting on a bottom surface of the trench; and pulsing a second copper precursor into the reaction chamber, wherein the catalyst layer causes the second copper precursor to react and fill the trench with a copper layer by way of a bottom-up fill mechanism;

wherein the first and second copper precursors are selected from the group consisting of $Cu(acac)_2$ (where acac=acetylacetonato), $Cu(thd)_2$ (where thd tetrahydrodionato), $CpCu(CNMe)$, $CpCu(CNCMe_3)$, $Cp*CuCO$, $CpCuPR_3$ (where R=Me, Et, or Ph), $CpCu(CSiMe_3)_2$, $MeCu(PPh_3)_3$, $CuMe$, $CuCCH$ (ethynylcopper), $CuCMe_3$(methylacetylidecopper), $(H_2C=CMeCC)Cu$ (3-methyl-3-buten-1-vnylcopper), $(MCH_2CH_2CC)Cu$ (1-pentyvylcopper), $CuCCPh$, $C_6H_5Cu$ (phenyl copper), $(ME)_3CCCCu$ (3,3-dimethvl-1-butynyl)copper, $(H_3CCH=CH)_2CuLi$, $Me_3SiCCCH_2Cu$, $CuCN$, n (where OAc=acetate), $Cu_2Cl_2$(butadiene), μ-copper, $C_7H_7CuO$(2-methoxyphenylcopper), $(CuCl)_2$, $(MeCN)_4CuX$ (where X=a halide, an alkyl, an amine, or a phevyl group), $Me_3SiOCu(PMe_3)_3$, $Cu(C_4H_4S)$, and a Cu-carbene compound.

5. The method of claim 4, wherein the barrier layer precursor comprises tantalum and nitrogen.

6. The method of claim 4, wherein the adhesion layer precursor comprises tantalum or ruthenium.

7. The method of claim 4, wherein the catalyst comprises iodine.

8. The method of claim 7, wherein the pulsing of the catalyst comprises pulsing an iodine precursor into the reaction chamber, wherein the iodine precursor reacts to form the catalyst layer.

9. The method of claim 8, wherein the iodine precursor comprises $I_2$, $C_2H_5I$, $C_2H_3I$, $CH_3I$, $CH_2I_2$, or $CHI_3$.

10. The method of claim 4, wherein the catalyst comprises bromine.

11. The method of claim 10, wherein the pulsing of the catalyst comprises pulsing a bromine precursor into the reaction chamber, wherein the bromine precursor reacts to form the catalyst layer.

12. The method of claim 11, wherein the bromine precursor comprises Br2, $CH_3Br$, or $C_2H_5Br$.

13. The method of claim 4, wherein the catalyst comprises a catalytic metal.

14. The method of claim 13, wherein the catalytic metal comprises indium acetate, indium acetylacetonate, indium (III) chloride, indium (III) bromide, indium (III) iodide, trimethylindium, tin hydride ($SnH_4$), tin acetate, tetraethyltin, or tin acetylacetonate.

15. The method of claim 4, wherein the pulsing of the barrier layer precursor, the pulsing of the adhesion layer precursor, the pulsing of the first copper precursor, the pulsing of the catalyst, and the pulsing of the second copper precursor are all performed without removing the semiconductor substrate from the reaction chamber.

\* \* \* \* \*